United States Patent
Conteras et al.

(10) Patent No.: US 6,850,378 B2
(45) Date of Patent: Feb. 1, 2005

(54) METHOD AND APPARATUS FOR PROVIDING QUADRATURE BIASING FOR COUPLED-PAIR CIRCUITS

(75) Inventors: John Thomas Conteras, San Jose, CA (US); Paul Wingshing Chung, San Jose, CA (US); Stephen Alan Jove, Hollister, CA (US); Kevin Roy Vannorsdel, San Jose, CA (US)

(73) Assignee: Hitachi Global Storage Technologies Netherlands BV (NL)

( * ) Notice: Subject to any disclaimer, the term of this patent is extended or adjusted under 35 U.S.C. 154(b) by 230 days.

(21) Appl. No.: 10/288,720

(22) Filed: Nov. 5, 2002

(65) Prior Publication Data

US 2004/0085663 A1 May 6, 2004

(51) Int. Cl.[7] .................................................. G11B 5/09
(52) U.S. Cl. ............................. 360/46; 360/66; 360/67; 327/55; 330/127; 330/252
(58) Field of Search .............................. 360/66, 46, 67; 327/55, 54, 52; 330/62, 127, 96, 252, 259, 267, 270, 273, 274, 285, 290, 296

(56) References Cited

U.S. PATENT DOCUMENTS

| | | | |
|---|---|---|---|
| 5,345,346 A | 9/1994 | Brannon et al. | |
| 5,444,579 A | 8/1995 | Klein et al. | |
| 5,691,663 A | 11/1997 | Nayebi et al. | |
| 5,831,784 A | 11/1998 | Barnett et al. | |
| 5,856,891 A | 1/1999 | Ngo | |
| 6,061,192 A | 5/2000 | Ogiwara | |
| 6,107,873 A | 8/2000 | Lorenz | |
| 6,134,060 A | 10/2000 | Ryat | |
| 6,226,137 B1 | 5/2001 | Ngo | |
| 6,271,977 B1 | 8/2001 | Chung et al. | |
| 6,275,347 B1 | 8/2001 | Ngo et al. | |
| 6,331,921 B1 * | 12/2001 | Davis et al. | 360/67 |
| 6,580,324 B2 * | 6/2003 | Palaskas et al. | 330/258 |

OTHER PUBLICATIONS

US 2001/0000981 A1, May 10, 2001, Nguyen.

* cited by examiner

Primary Examiner—Alan T. Faber
(74) Attorney, Agent, or Firm—Crawford Maunu PLLC

(57) ABSTRACT

A method and apparatus for providing quadrature biasing for coupled-pair circuits. A QBCP-circuit for quadrature amplifiers provides a new input common-mode sense point that separates the inputs for the differential-and-common mode feedback-control loops. The QBCP circuit biases all four transistors equivalently and reduces the feedback-loop interaction, thereby simplifying the bias control system and improves the voltage-transfer frequency-response performance.

24 Claims, 11 Drawing Sheets

METHOD AND APPARATUS FOR PROVIDING QUADRATURE BIASING FOR COUPLED-PAIR CIRCUITS

BACKGROUND OF THE INVENTION

1. Field of the Invention

This invention relates in general to magnetic storage systems, and more particularly to a method and apparatus for providing quadrature biasing for coupled-pair circuits.

2. Description of Related Art

Magnetic recording systems that utilize magnetic disk and tape drives constitute the main form of data storage and retrieval in present-day computer and data processing systems. In the recording process, information is written and stored as magnetization patterns on the magnetic recording medium. Scanning a write head over the medium and energizing the write head with appropriate current waveforms accomplish this recording process. In a read-back process, scanning a read sensor over the medium retrieves the stored information. This read sensor intercepts magnetic flux from the magnetization patterns on the recording medium and converts the magnetic flux into electrical signals, which are then detected and decoded.

In high capacity storage systems, magnetoresistive read sensors using a higher sensitive giant magnetoresistance effect, commonly referred to as giant magnetoresistive (GMR) heads, are the prevailing read sensor because of their capability to read data from a surface of a recording medium at greater track and linear densities. Hereinafter, the term "MR head" or "MR sensor" will be used to refer to a magnetoresistive sensor in the general sense, i.e., any MR sensor including GMR sensors.

An MR sensor detects a magnetic field through the change in resistance of its MR sensing layer (also referred to as an "MR element") as a function of the strength and direction of the magnetic flux being sensed by the MR layer. To convert the changes in resistance into a usable voltage signal, MR heads are typically biased with a current that creates a voltage drop across the resistive portion of the MR head. Ideally, the bias current is controlled so that any changes in the voltage drop across the MR head are attributed to changes in the resistance of the head. Thus, when the head is properly biased, the voltage across the head tracks the changes in the magnetic fields, making the voltage useful as a read signal.

Often, the voltage across the MR head is amplified by a differential amplifier. To improve the linearity of the differential amplifier, it is advantageous that the MR head be biased so that the MR head's two terminals have the same voltage magnitude but opposite voltage polarity from each other. When the MR head is biased in this manner, an increase in the resistance of the MR head due to a magnetic field causes an increase in the voltage of one terminal of the head and an equivalent decrease in the voltage of the other terminal of the head.

One type of differential amplifier is a quadrature-type amplifier. Quadrature-type amplifiers are biased/balanced by Quadrature Biasing for Coupled Pair (QBCP) circuits, where said amplifiers have input-coupled pairs which can require relatively large dc-input-voltage offsets. Quadrature-type amplifier circuits have unique biasing challenges. One such biasing challenge is that the four transistors in the quadrature-type amplifier require equivalent biasing conditions for the amplifier's transistors to properly operate in their linear region. Another biasing challenge is that the quadrature-type amplifier, with prior-art bias-control schemes, can have undesirable bias feedback-loop interactions which requires higher-order control schemes.

A prior bias-control scheme for a quadrature-type amplifier 1000 is shown in FIG. 10. FIG. 10 shows a bias-control scheme wherein the bias of transistors Q1 1010 and Q2 1012 are made to be equivalent by sensing the voltage between Node C 1020 and Node D 1022. The bias of transistors Q3 1024 and Q4 1026 then rely on the Integrated Circuits (IC) process tracking tolerances, which vary depending on the particular process. This bias-control scheme has tightly coupled input-and-output, differential-and-common mode control loops. The bias-control scheme of FIG. 10 creates an accuracy issue with biasing across the MR sensor 1040. The bias-control scheme of FIG. 10 has an undesirable frequency response because of its second order high pass response which therefore causes non-linear phase distortion. Accordingly, the high pass frequency point must be moved lower. The bias-control scheme of FIG. 10 has a longer transient recovery and therefore does not switch as quickly.

FIG. 11 shows the control-signal flow-graph 1100 for the schematic in FIG. 10. A higher-order control scheme is created by sensing the coupled sense points $V_{out}$ 1110 and $V_{Pdiff}$ 1120 (coupled by $G_3$ 1130, the voltage transfer to Nodes C and D). However, with this higher-order control scheme, there is no independent common-mode sense point. Furthermore, the analysis, implementation, and modification are more involved due to the interactions among the control loops.

It can then be seen that there is a need for a method and apparatus for ensuring that the biasing through all four transistors in a quadrature biasing for coupled pair circuits is equivalent.

It can then be seen that there is a need for a method and apparatus for quadrature biasing for coupled pair circuits that reduce the feedback-loop interaction to simplify the bias control system.

SUMMARY OF THE INVENTION

To overcome the limitations in the prior art described above, and to overcome other limitations that will become apparent upon reading and understanding the present specification, the present invention discloses a method and apparatus for providing quadrature biasing for coupled-pair circuits.

The present invention solves the above-described problems by providing a QBCP-circuit for quadrature amplifiers with a new input common-mode sense point The sense point separates the inputs, typically coupled, for the differential-and-common mode feedback-control loops. The QBCP-circuit according to the present invention may also couple or separate the differential-and-common mode feedback-control loops' outputs. The QBCP circuit biases all four transistors in the transconductance stage equivalently and reduces the feedback-loop interaction, thereby simplifying the bias control system.

An apparatus in accordance with the principles of the present invention includes a transconductance stage for generating a bias voltage across a transducer, a differential-common-mode operational transconductance amplifier for generating control signals for balancing the bias voltage across the transducer, a common-mode feedback loop and a differential-mode feedback loop, wherein the common-mode feedback loop includes a common-mode sense point and the differential-mode feedback loop includes a differential-mode sense point, wherein common-mode sense point and differential-mode sense point are separate and independent.

In another embodiment of the present invention, a method for providing quadrature biasing for a quadrature amplifier is provided. The method includes providing a differential-common-mode operational transconductance amplifier for generating control signals for balancing a bias voltage across a transducer and providing a common-mode feedback loop and a differential-mode feedback loop with separated inputs to reduce interaction between the common-mode feedback loop and a differential-mode feedback loop.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiments in which the invention may be practiced. It is to be understood that other embodiments may be utilized as structural changes may be made without departing from the scope of the present invention.

The present invention provides a method and apparatus for providing quadrature biasing for coupled-pair circuits. The present invention provides a QBCP-circuit for quadrature amplifiers with a new input common-mode sense point. The sense point separates the inputs, typically coupled, for the differential-and-common mode feedback-control loops. The QBCP-circuit according to the present invention may also couple or separate the differential-and-common mode feedback-control loops' outputs. The QBCP circuits according to the present invention make the biasing through all four transistors equivalent. In addition, the QBCP circuits according to the present invention reduce the feedback-loop interaction, thereby simplifying the bias control system.

Figure 1:
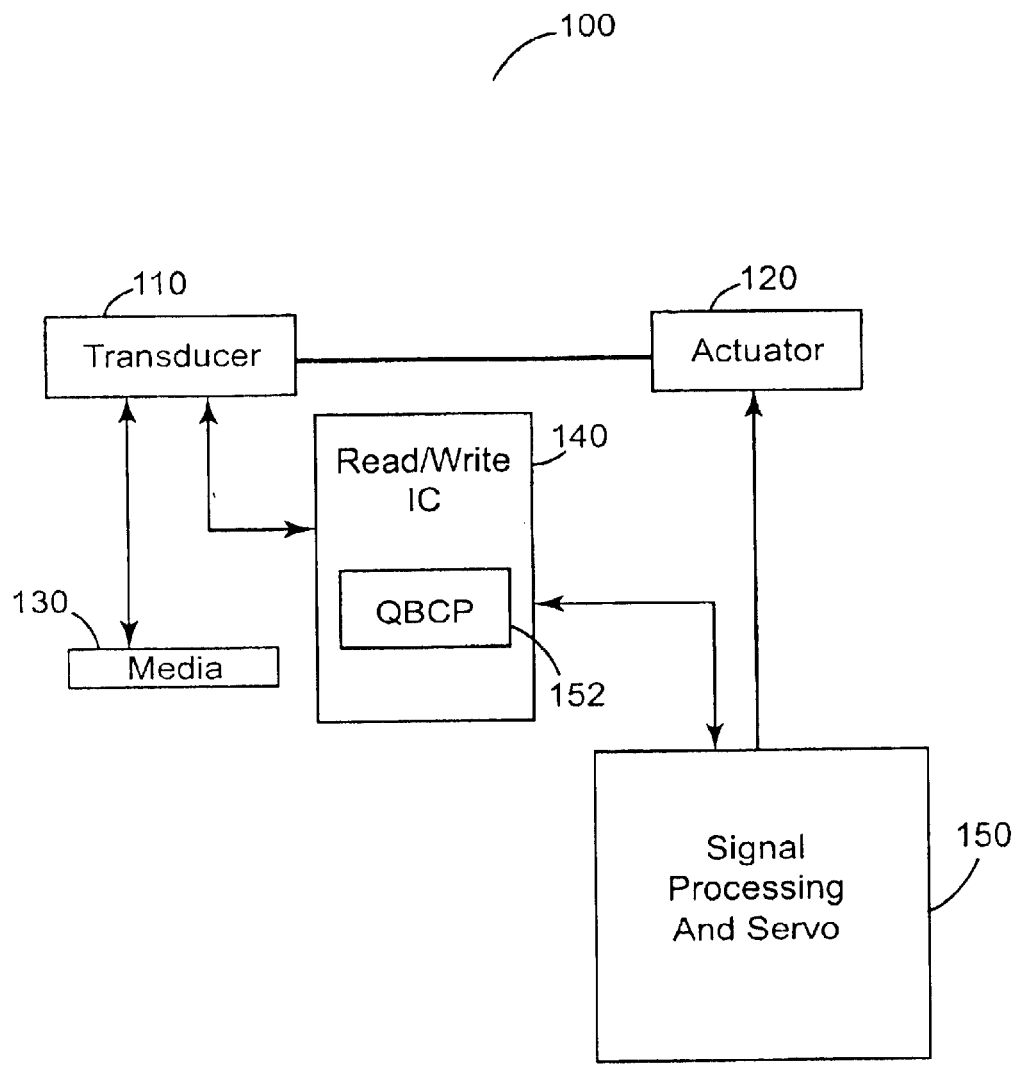
FIG. 1 illustrates a storage system according to the present invention.

FIG. 1 illustrates a storage system 100. In FIG. 1, a transducer 110 is positioned by actuator 120. The actuator 120 controls the position of the transducer 110. The transducer 110 writes and reads data on magnetic media 130. The read/write signals are passed to a read/write Integrated Circuit (IC) 140. A signal processor and servo system 150 controls the actuator 120 and processes the signals of the data channel 140. More particularly, the read/write IC 140 includes a device for providing matched differential MR biasing and pre-amplification 152 according to the present invention. Nevertheless, the present invention is not meant to be limited to a particular type of storage system 100 or to the type of media 130, or to the type of read transducer 110 used in the storage system 100.

Figure 2:
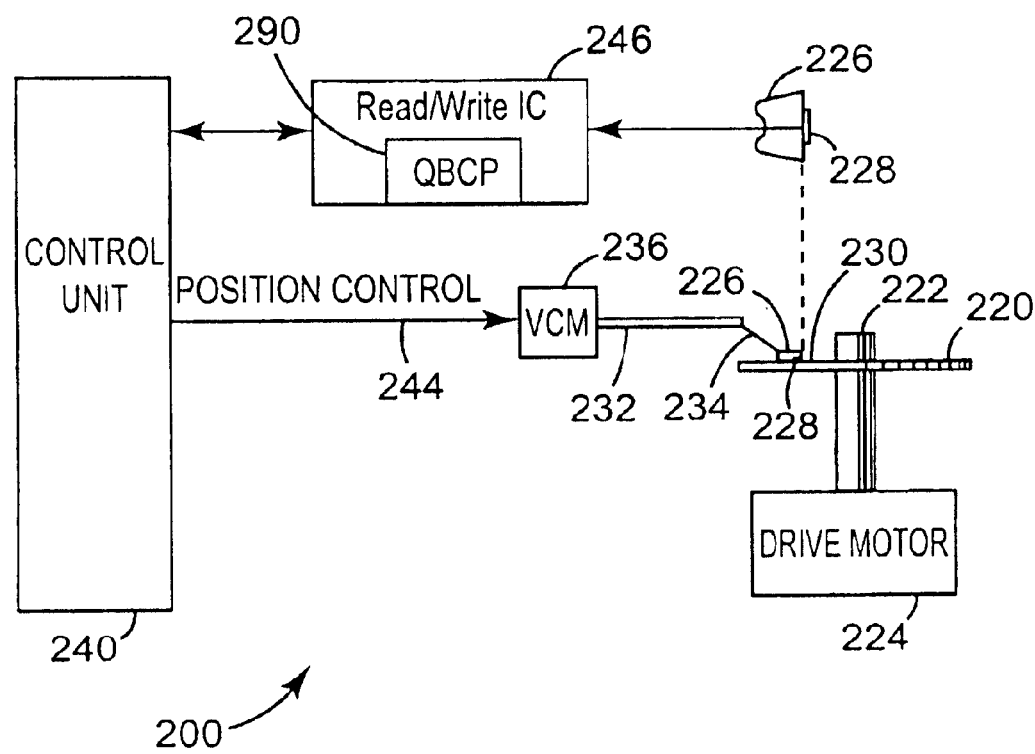
FIG. 2 is an illustration of one example of a magnetic disk drive storage system.

FIG. 2 is an illustration of one example of a magnetic disk drive storage system 200. As shown in FIG. 2, at least one rotatable magnetic disk 220 is supported on a spindle 222 and rotated by a disk drive motor 224. The magnetic recording media on each disk 220 is in the form of an annular pattern of concentric data tracks (not shown).

At least one slider 226 is positioned on the disk 220, each slider 226 supporting one or more magnetic read/write heads 228. As the disk(s) 220 rotate, slider 226 is moved radially in and out over disk surface 230 so that heads 228 may access different portions of the disk 220 where desired data is recorded. Each slider 226 is attached to an actuator arm 232 by means of a suspension 234. The suspension 234 provides a slight spring force, which biases slider 226 toward the disk surface 230. Each actuator arm 232 is attached to the actuator 236. The actuator 236 position may be controlled by a voice coil motor (VCM). The VCM has a coil movable within a fixed magnetic field, the direction and speed of the coil movements being controlled by position control current signals 244 supplied by a control unit 240.

During operation of the disk drive 200, the rotation of the disk 220 generates an air bearing between slider 226 and the disk surface 230, which exerts an upward force or lift on the slider 226. The surface of the slider 226, which includes head 228 and faces the surface of disk 220, is referred to as an air-bearing surface (ABS). The air bearing thus counterbalances the slight spring force of suspension 234 and, during normal operation, supports the slider 226 off of, and slightly above, the disk surface 230 at a small, substantially constant spacing.

The various components of the disk drive 200 are controlled in operation by control signals generated by a control unit 240, such as access control signals and internal clock signals. Typically, control unit 240 has logic control circuits, storage apparatus, and a microprocessor. The control unit 240 generates control signals to control various system operations such as drive motor position control signals on line 244. The control signals on line 244 provide the desired current profiles to optimally move and position the slider 226 to the desired data track on the disk 220. Read and write signals are communicated to and from read/write heads 228 through read/write IC 246. More particularly, the read/write IC 246 in accordance with the present invention may include a device for providing matched differential MR biasing and pre-amplification 290 according to the present invention.

The above description of a typical magnetic disk drive storage system 200 is provided for representation purposes only. It should be apparent that disk storage systems may contain a large number of disks and actuators, and that each actuator may support a number of sliders. Many other variations of the basic typical magnetic disk drive storage system 200 may be used in conjunction with the present invention while keeping within the scope and intention of the invention. However, those skilled in the art will recognized that the present invention is not meant to be limited to magnetic disk drive storage systems as illustrated in FIG. 2.

Figure 3:
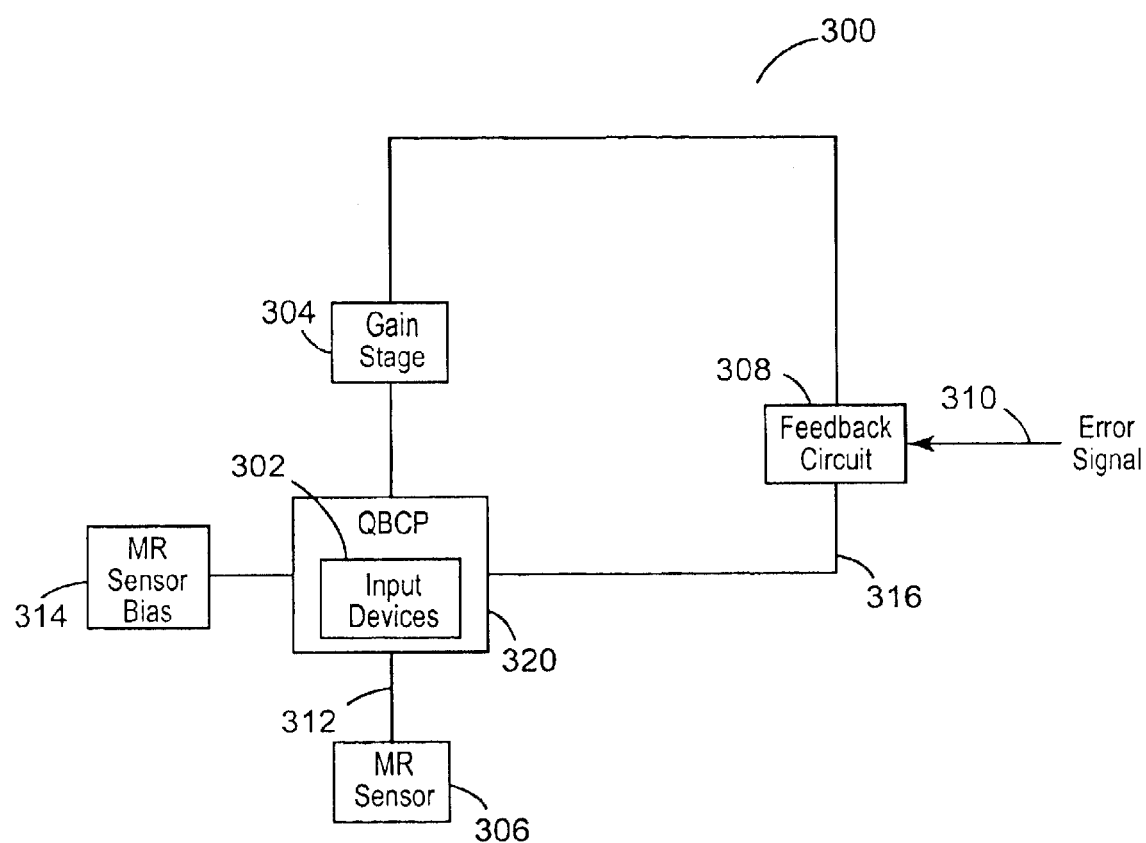
FIG. 3 depicts a high-level block diagram of MR read sensor system in accordance with the present invention.

FIG. 3 depicts a high-level block diagram of MR read sensor system 300 in accordance with the present invention. The system 300 is used in conjunction with a magnetoresistive (MR) sensor 306. A magnetic field, for example generated by the recording media on the surface of a disk, causes a change in the resistance of the MR sensor 306. These changes are used to read data stored by the recording media. The changes can be read because MR sensor bias 314, which connects to a quadrature-type amplifier that is biased/balanced by a quadrature biasing for coupled pair (QBCP) circuit 320, properly biases the MR sensor 306 via interconnect 312.

In FIG. 3, the system includes one or more input device(s) 302. The system 300 also includes a gain stage 304, and a feedback circuit 308. The signal from the MR sensor 306 is provided to the input device(s) 302 of the system 300. The feedback circuit 308 controls one or more signal(s) 316 based on one or more error signal(s) 310.

The signal(s) 316 may be subtracted from or added to a bias current provided to the input device(s) 302. The input impedance of the system 300 may be controlled to match the characteristic impedance of the interconnect 312. Also, the input impedance of the system 300 may be controlled based on the resistance of the MR sensor 306.

Figure 4:
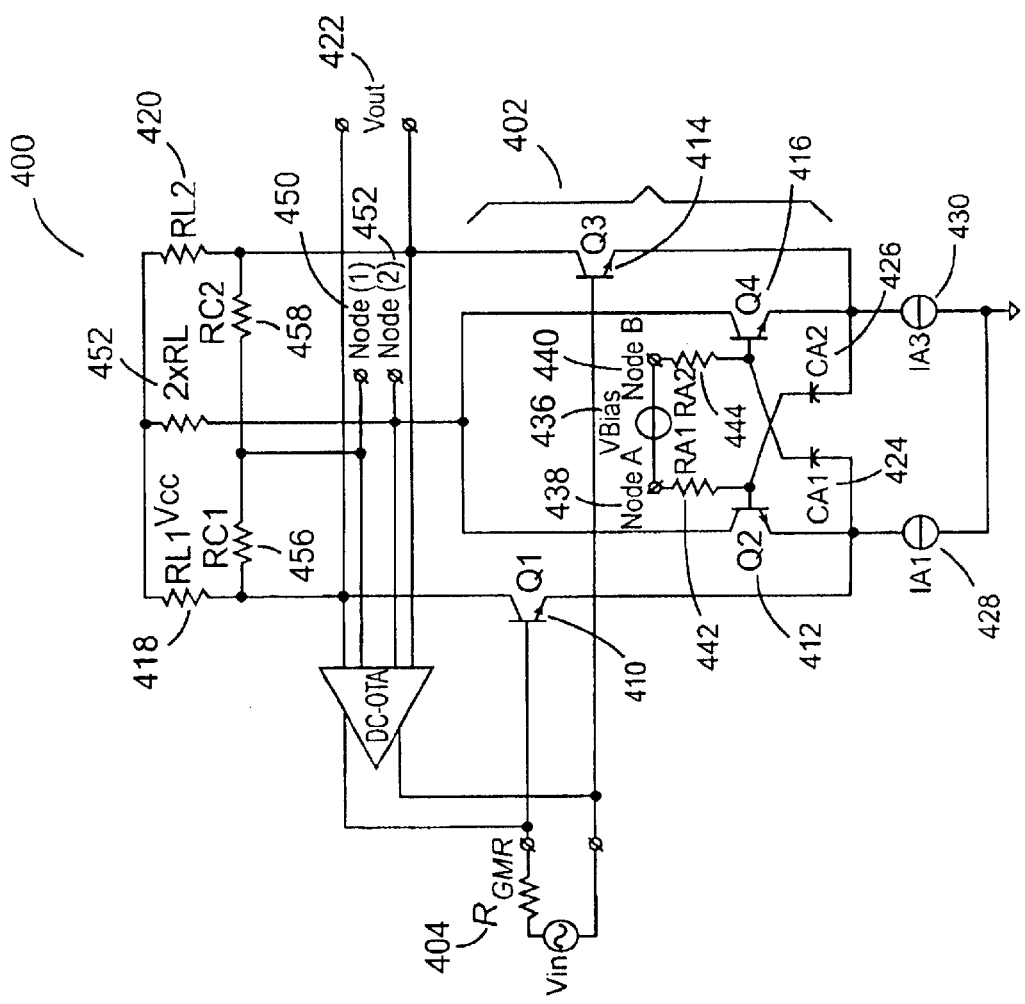
FIG. 4 illustrates a Quadrature-type amplifier with a QBCP circuit as applied to a $R_{GMR}$ transducer requiring a dc-bias.

FIG. 4 illustrates a Quadrature-type amplifier according to the present invention 400 with a QBCP circuit 402 applied to a $R_{GMR}$ transducer 404 requiring a dc-bias. A QBCP circuit 402 is part of the feedback path of the quadrature-type amplifier 400. The feedback path is comprised of the QBCP circuit 402 and the common-and-differential mode sense points (to generate error signals) along with the Differential-Common-Mode Operational Transconductance Amplifier (DC-OTA) (to generate control signals). The quadrature-type amplifier 400 according to the present invention uses a double-pair bipolar transistor topology, as shown in FIG. 4 The quadrature-type amplifier 400 amplifies with the transconductance stage comprised of transistors Q1 410, Q2 412, Q3 414, and Q4 416. The resistors RL1 418 and RL2 420 transform the current signal into a voltage signal at $V_{out}$ 422. The capacitors, CA1 424 and CA2 426, are ac-coupling capacitors that ac couple the signal in the band-pass frequency region. Also, shown in FIG. 4 are the equivalent current sources, IA1 428 and IA2 430, that are used for the tail bias-current of transistor pairs Q1 410, Q2 412, and Q3 414, Q4 416. The transistors Q1 410, Q2 412, Q3 414, and Q4 416 require equivalent bias controls. The transistors Q1 410 and Q3 414 are the input transistor pair, while transistors Q2 412 and Q4 416 are the dc-bias transistor pair for the input.

The quadrature-type amplifier according to the present invention as shown in FIG. 4 includes a source impedance/ transducer ($R_{GMR}$) 404. For this case, the quadrature-type amplifier requires a dc bias reference (VBias) 436 which is applied at Nodes A 438 and B 440 through isolation resistors, RA1 442 and RA2 444. This controls the base voltage transistor Q1 410 and transistor Q3 414, such that the amplifier's dc-bias reference voltage 436 is imposed across the $R_{GMR}$ 404.

The QBCP circuit 402 achieves an independent input for the common-mode voltage feedback by comparing the combined collector-currents of transistors Q1 410 and Q3 414 (through the equivalent resistors RL1 418 and RL2 420 (Node 1 450)), to the combined collector-currents of transistors Q2 412 and Q4 416 (through the resistor 2xRL 452 (Node 2 454) half the value of RL1 418). The equivalent resistors, RC1 456 and RC2 458, have relatively large resistance values compared to the values of RL1 418 and RL2 420. This value difference makes the common-mode voltage of $V_{out}$ 422 present at Node 1 450.

The QBCP circuit 402 according to the present invention achieves an independent input for the differential-mode voltage feedback by only sensing the $V_{out}$ voltage 422. The two feedback loops control both the voltage between Node 1 450 and Node 2 452, and the voltage $V_{out}$ 422 independently, so that they are at or near zero volts.

Figure 5:
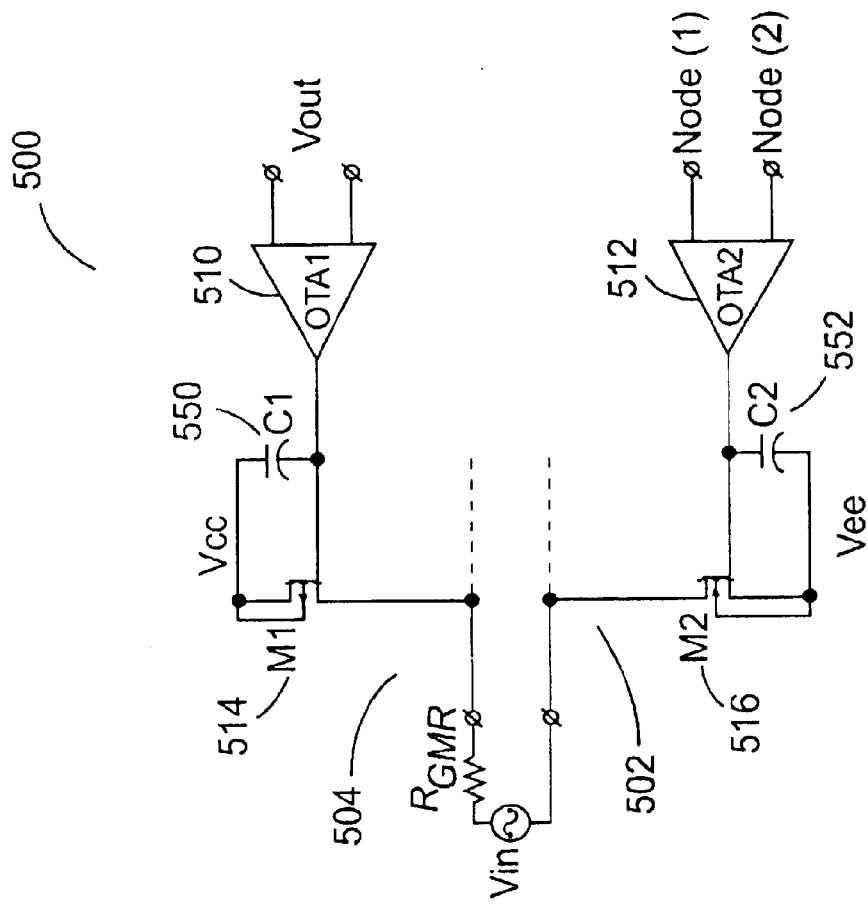
FIG. 5 illustrates a DC-OTA of a QBCP circuit with coupled outputs according to the present invention.

FIG. 5 illustrates a DC-OTA of a QBCP circuit with coupled outputs 500 according to the present invention. That is, the common 502 and differential 504 control loops are coupled at the outputs of OTA1 510 and OTA2 512. The Operational Transconductance Amplifiers (OTA1 510 and OTA2 512) transform the input voltage into currents, which then set the gate voltage of MOS transistors, M1 514 and M2 516 respectively.

Figure 6:
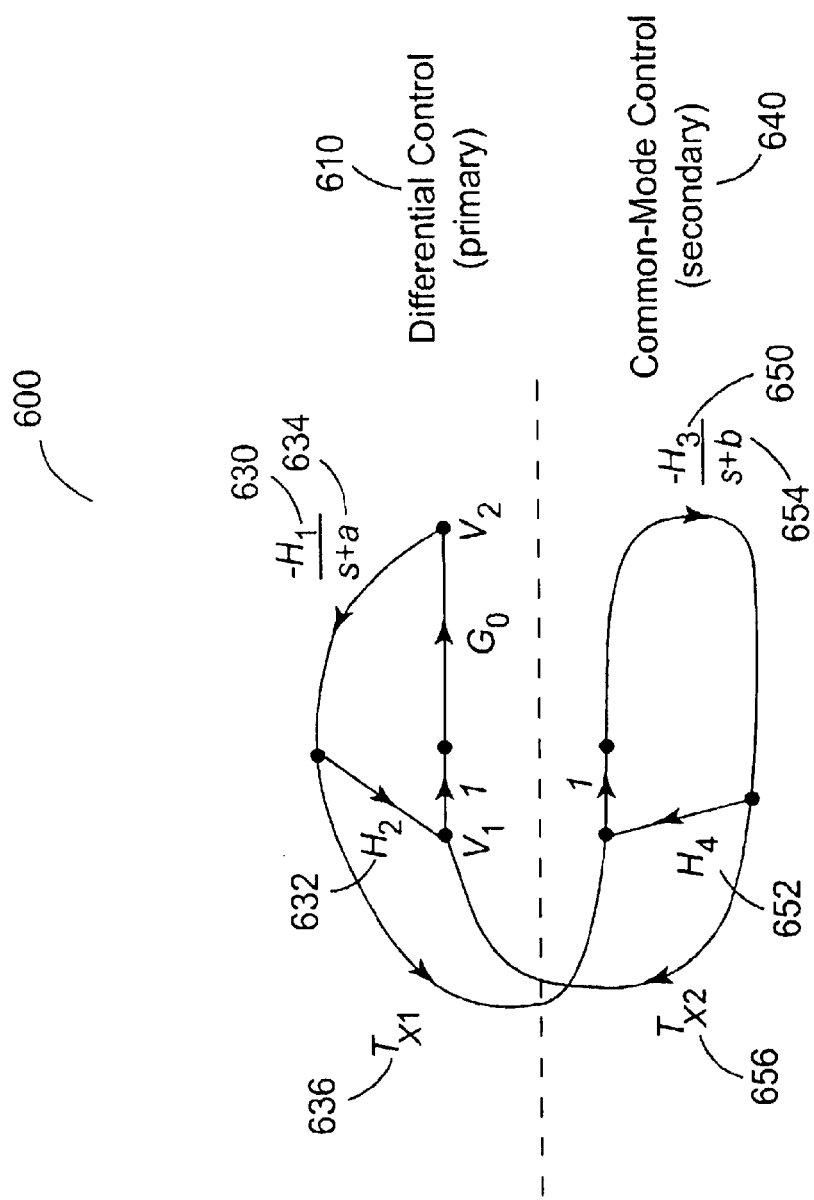
FIG. 6 illustrates the control-signal flow-graph for the DC-OTA of a QBCP circuit with coupled outputs according to the present invention.

FIG. 6 illustrates the control-signal flow-graph 600 for the DC-OTA of a QBCP circuit with coupled outputs according to the present invention. The primary differential-control feedback path 610 is comprised of three elements: 1) the feedback gain transfer H1 630, 2) the output current transfer H2 632, and 3) the frequency roll-off pole (a) 634. Pole (a) 634 is set by the capacitor C1 (550) and the output impedance of OTA1 (510). The coupled output transfer, Tx1 636, is created from transistor M1's (514) single-sided current-injection at the amplifier's input.

The secondary common-mode control feedback path 640 is similarly comprised of three elements: 1) the feedback gain transfer H3 650, 2) the output current transfer H4 652, and 3) the frequency roll-off pole (b) 654. Pole (b) is set by the capacitor C2 (552) and the output impedance of OTA2 (512). The coupled output transfer, Tx2 656, is created from transistor M2's (516) single-sided current-injection at the amplifier's input.

Figure 7:
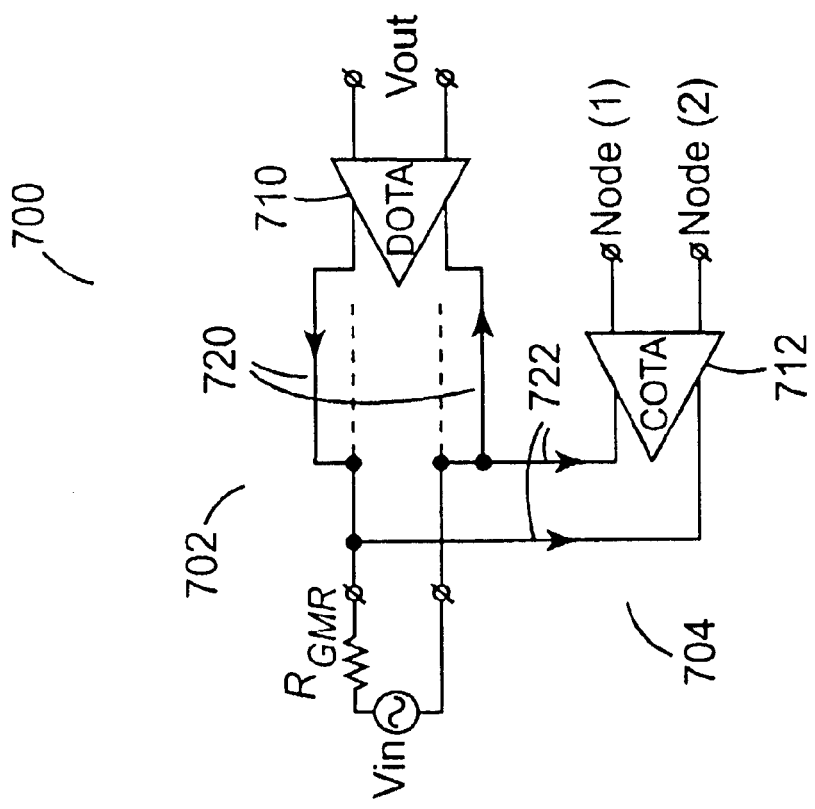
FIG. 7 illustrate a DC-OTA of a QBCP circuit with separate outputs according to the present invention.

FIG. 7 illustrate a DC-OTA of a QBCP circuit with separate outputs 700 according to the present invention. In other words, the DC-OTA of a QBCP circuit with separate outputs has common 704 and differential 702 control loops that are separate at their outputs. The Differential-Mode Operational Transconductance Amplifier (DOTA) 710 has matched push-and-pull output currents 720, while the Common-Mode Operational Transconductance Amplifier (COTA) 712 has two matched current sources 722.

Figure 8:
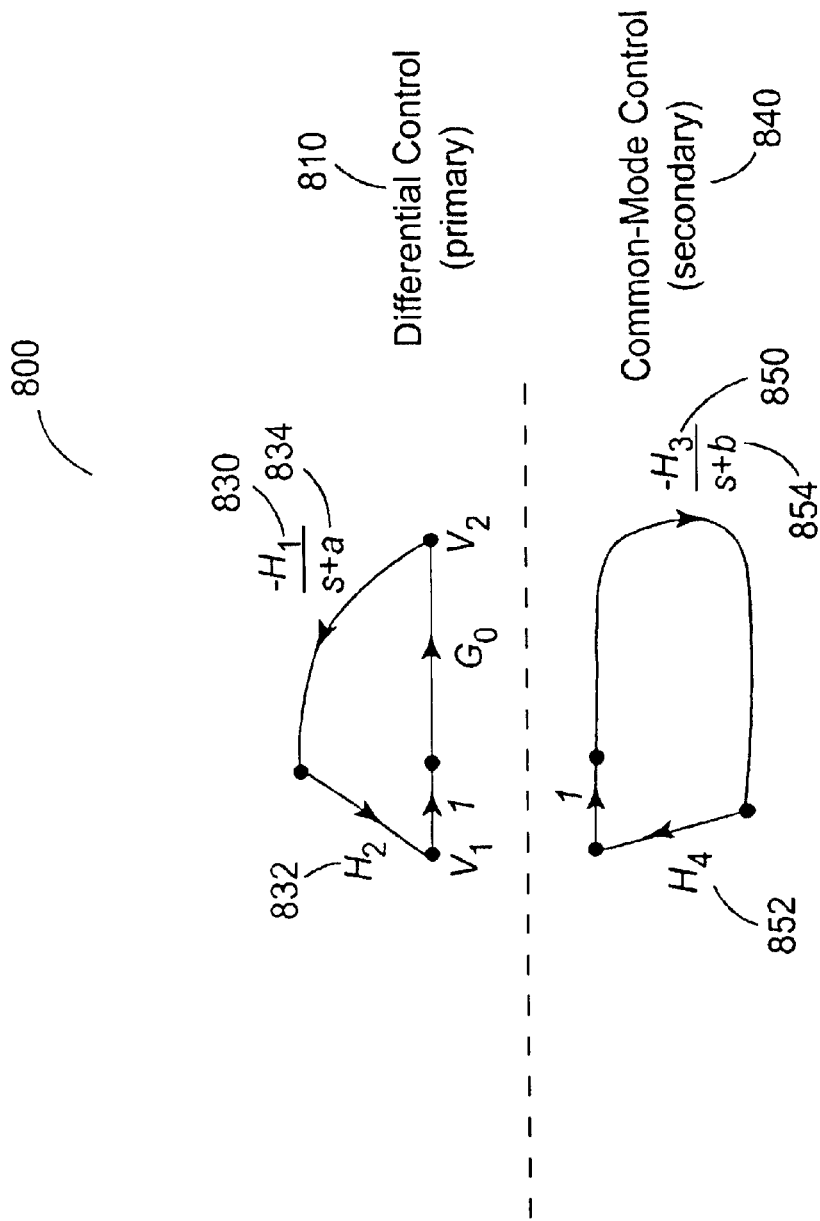
FIG. 8 illustrates the control-signal flow-graph for the DC-OTA of a QBCP circuit with separate outputs according to the present invention.

FIG. 8 illustrates the control-signal flow-graph 800 for the DC-OTA of a QBCP circuit with separate outputs according to the present invention. Here, the primary feedback path 810 is comprised of two elements: 1) the feedback gain transfer H1 830 and 2) the output current transfer H2 832. This output-connection scheme has no transfer coupling to the common-mode control.

Similarly, the secondary feedback path 840 is comprised of two elements: 1) the feedback gain transfer H3 850 and 2) the output current transfer H4 852. Again, there is no transfer coupling to the differential-mode control. Here, the frequency roll-off poles (a) 834 and (b) 854 are integrated in the DOTA and COTA respectively.

Figure 9:
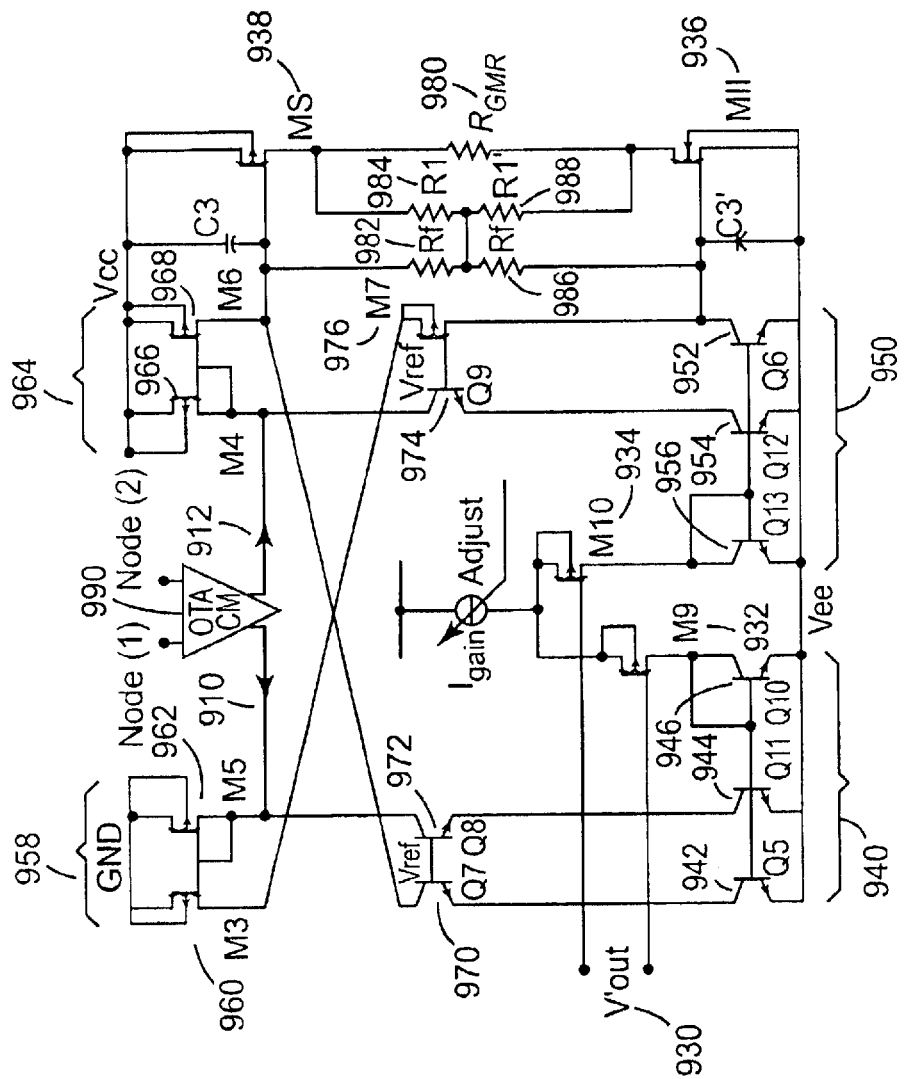
FIG. 9 shows a DC-OTA of a QBCP circuit with separate control outputs according to the present invention.
Figure 10:
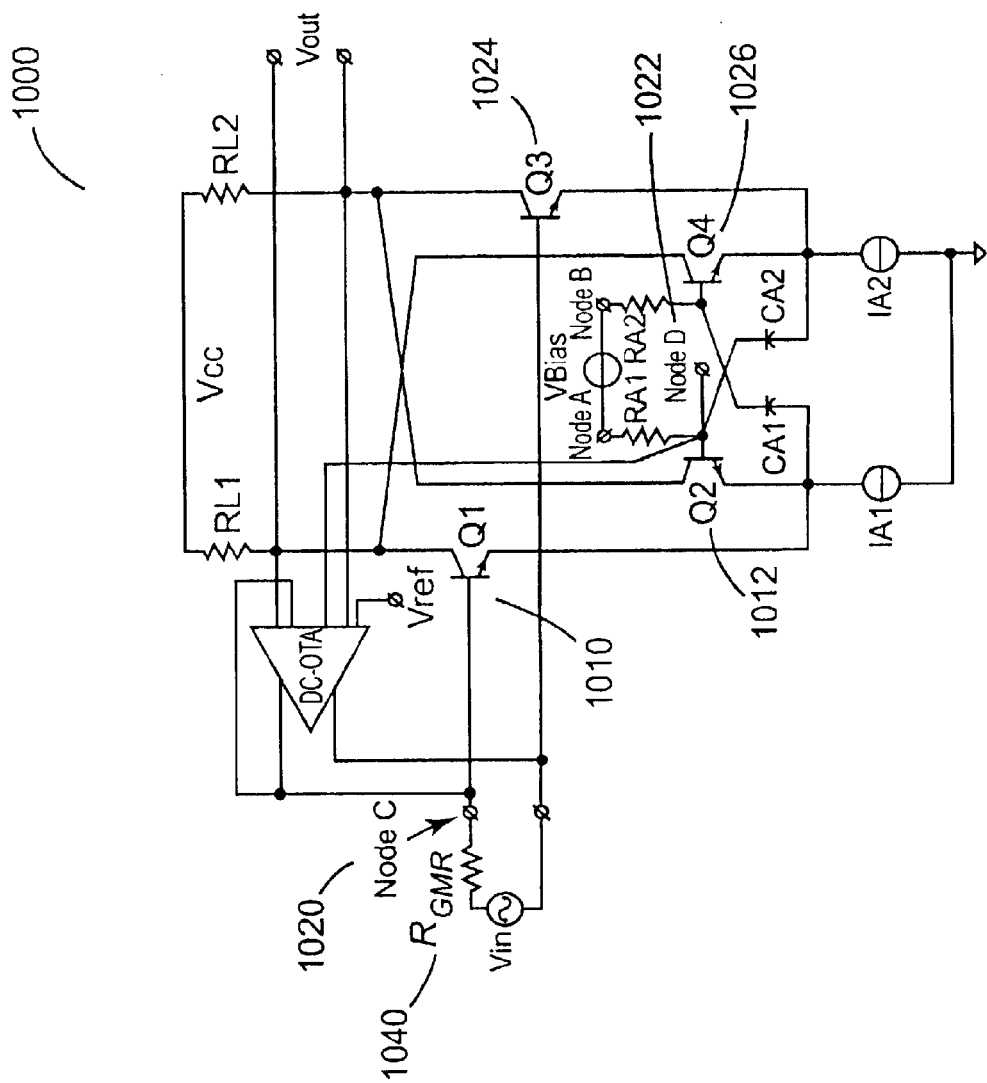
FIG. 10 illustrates a prior bias-control scheme for a quadrature-type amplifier.
Figure 11:
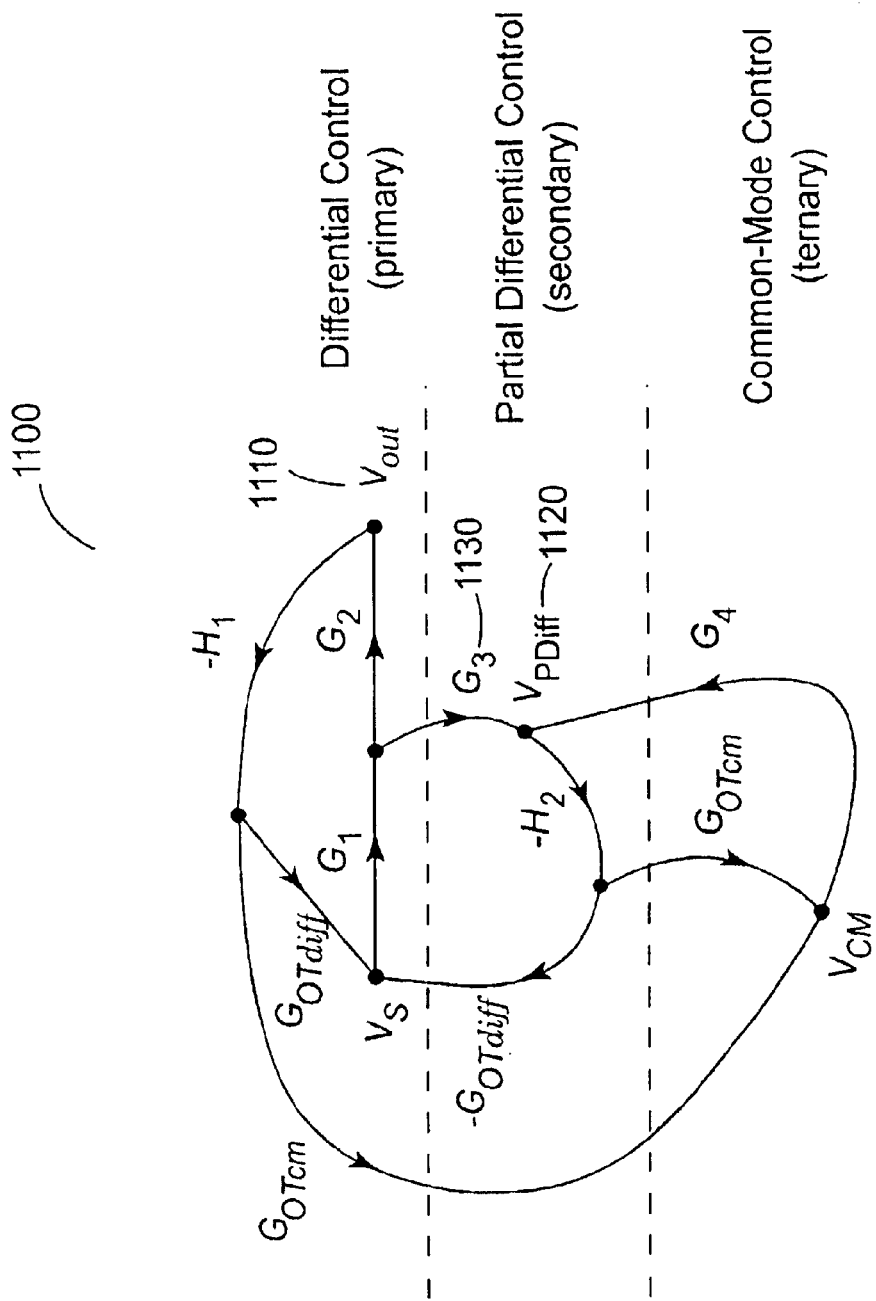
FIG. 11 shows the control-signal flow-graph for the schematic in FIG. 10.

FIG. 9 shows a DC-OTA 900 of a QBCP circuit with separate control outputs according to the present invention. The DC-OTA 900 of a QBCP circuit with separate control outputs according to the present invention has the two inputs 910, 912 decoupled at its output. The $V_{out}$ voltage is level shifted to the proper voltage level ($V'_{out}$) 930 for the two differential input transistors M9 932 and M10 934. Each differential input transistor's output drain current is then translated to the gates of transistors M11 936 and M8 938, by four current-mirror transistor sets: a first set 940 comprising Q5 942, Q10 944, and Q11 946; a second set 950 comprising Q6 952, Q 13 954, and Q12 956; a third set 958 comprising M3 960 and M5 962; and a fourth set 964 M4 966 and M6 968. Transistors Q7 970, Q8 972, Q9 974, and M7 976 are used to over-voltage protect the four current-mirror transistor sets 940, 950, 960, 964. The common-mode input control feeds through the OTA-CM and a common-mode current is injected at the gates of the two transistor pairs M3 960 and M5 962, and M4 966 and M6 968. This current injection then causes a common-mode voltage at $R_{GMR}$ 980. Two internal feedback resistor pairs Rf 982 and R1 984, and Rf 986 and R1' 988, serve as a common-mode gain reducer. These two resistor pairs then increase the common-mode transfer's linear region.

Accordingly, the present invention provides a method and apparatus for providing quadrature biasing for coupled-pair circuits. The present invention provides a QBCP-circuit for quadrature amplifiers with a new input common-mode sense point. The sense point separates the inputs, typically coupled, for the differential-and-common mode feedback-control loops. The QBCP-circuit according to the present invention may also couple or separate the differential-and-common mode feedback-control loops' outputs. The QBCP circuits according to the present invention make the biasing through all four transistors equivalent. In addition, the QBCP circuits according to the present invention reduce the feedback-loop interaction, thereby simplifying the bias control system, and improve the voltage-transfer frequency-response performance.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A quadrature amplifier, comprising:
 a transconductance stage for generating a bias voltage across a transducer;
 a differential-common-mode operational transconductance amplifier for generating control signals for balancing the bias voltage across the transducer;
 a common-mode feedback loop; and
 a differential-mode feedback loop;
 wherein the common-mode feedback loop includes a common-mode sense point and the differential-mode feedback loop includes a differential-mode sense point, wherein common-mode sense point and differential-mode sense point are separate and independent.

2. The quadrature amplifier of claim 1 wherein the transconductance stage comprises a dc bias reference.

3. The quadrature amplifier of claim 2 wherein the transconductance stage comprises dual input coupled transistor pairs.

4. The quadrature amplifier of claim 3 wherein the each of the input coupled transistor pair comprises an input transistor and a dc bias transistor.

5. The quadrature amplifier of claim 4 wherein each input transistor has a base voltage controlled by a dc bias reference for imposing the dc bias reference across the transducer.

6. The quadrature amplifier of claim 1 wherein the common-mode feedback loop and differential-mode feedback loop have coupled outputs.

7. The quadrature amplifier of claim 1 wherein the common-mode feedback loop and differential-mode feedback loop have separate outputs.

8. The quadrature amplifier of claim 1 wherein the differential-common-mode operational transconductance amplifier comprises a differential-mode operational transconductance amplifier having matched push-and-pull output currents and a common-mode operational transconductance amplifier having two matched current sources.

9. The quadrature amplifier of claim 1 wherein the differential-common-mode operational transconductance amplifier comprises a differential-mode operational transconductance amplifier and a common-mode operational transconductance amplifier having separate control outputs.

10. The quadrature amplifier of claim 1 further comprising a first and second resistor coupled to the transconductance stage for transforming current signals of the transconductance stage into a voltage output.

11. The quadrature amplifier of claim 10 further comprising a first and second capacitor coupled to the transconductance stage for ac coupling the voltage output in a bandpass frequency region.

12. The quadrature amplifier of claim 1 further comprising a pair of equivalent current sources for providing tail bias current to the transconductance stage.

13. The quadrature amplifier of claim 1 wherein the transconductance stage comprises dual input coupled transistor pairs, each of the input coupled transistor pairs comprising an input transistor and a dc bias transistor, the input transistors providing a first combined collector current at a first node and the dc bias transistors providing a second combined collector current at a second node, wherein the first combined collector current at the first node and the second combined collector current at the second node capable of being compared to provide an independent input for the common-mode feedback loop.

14. The quadrature amplifier of claim 13 further comprising a first and second resistor coupled to the transconductance stage for transforming current signals of the transconductance stage into a voltage output, wherein the common-mode feedback loop and the differential-mode feedback loop control a voltage between the first node and the second node, and the voltage output.

15. The quadrature amplifier of claim 14 wherein the voltage between the first node and the second node, and the voltage output are maintained at substantially zero volts.

16. The quadrature amplifier of claim 1 wherein the transconductance stage comprises a first input transistor and a second input transistor, the first and second input transistor being coupled to a first and second resistor for transforming collector currents of the first and second input transistors into a voltage output.

17. The quadrature amplifier of claim 16 further comprising a third and fourth resistor coupled in series across the first and second resistors in a voltage divider arrangement, the resistance of the third and fourth resistor being substantially greater than the resistance of the first and second resistors for imposing the voltage output at a node between the third and fourth resistors.

18. A method for providing quadrature biasing for a quadrature amplifier, comprising:
providing a differential-common-mode operational transconductance amplifier for generating control signals for balancing a bias voltage across a transducer; and
providing a common-mode feedback loop and a differential-mode feedback loop with separated inputs to reduce interaction between the common-mode feedback loop and a differential-mode feedback loop.

19. The method of claim 18 wherein the providing further comprises establishing an input common-mode sense point for the common-mode feedback loop, wherein the input common-mode sense point decouples inputs of the common-mode feedback loop and the differential-mode feedback loop.

20. The method of claim 18 further comprising providing the common-mode feedback loop and differential-mode feedback loop with coupled outputs.

21. The method of claim 18 further comprising providing the common-mode feedback loop and differential-mode feedback loop with separated outputs.

22. The method of claim 18 wherein the providing the differential-common-mode operational transconductance amplifier further comprises providing a differential-mode operational transconductance amplifier and a common-mode operational transconductance amplifier having separate control outputs.

23. The method of claim 18 wherein the providing the common-mode feedback loop and the differential-mode feedback loop further comprises providing an equivalent bias to transistors in a transconductance stage.

24. A storage system, comprising:
at least one moveable storage medium for storing data thereon;
a motor for causing movement to the at least one moveable storage medium;
an actuator assembly having an actuator arm and a sensor disposed at a distal end of the actuator arm, the sensor for reading and writing data on the disk;
a quadrature amplifier, coupled to the sensor, for biasing the sensor and processing read signals from the sensor, the quadrature amplifier further comprising:
a transconductance stage for generating a bias voltage across a transducer,
a transconductance stage for generating a bias voltage across the sensor;
a differential-common-mode operational transconductance amplifier for generating control signals for balancing the bias voltage across the sensor;
a common-mode feedback loop; and
a differential-mode feedback loop,
wherein the common-mode feedback loop includes a common-mode sense point and the differential-mode feedback loop includes a differential-mode sense point, wherein common-mode sense point and differential-mode sense point are separate and independent.

* * * * *

UNITED STATES PATENT AND TRADEMARK OFFICE
CERTIFICATE OF CORRECTION

PATENT NO.   : 6,850,378 B2
DATED        : February 1, 2005
INVENTOR(S)  : Conteras et al.

It is certified that error appears in the above-identified patent and that said Letters Patent is hereby corrected as shown below:

Title page,
Item [75], Inventors, "John Thomas Conteras, San Jose, CA (US);" should read
-- John Thomas Conteras, Palo Alto, CA (US); --.

Signed and Sealed this

Sixteenth Day of August, 2005

JON W. DUDAS
*Director of the United States Patent and Trademark Office*